United States Patent
Mao et al.

(10) Patent No.: US 12,406,951 B2
(45) Date of Patent: Sep. 2, 2025

(54) REDISTRIBUTION LAYER HAVING A SIDEVIEW ZIG-ZAG PROFILE

(71) Applicant: NXP B.V., Eindhoven (NL)

(72) Inventors: Kuan-Hsiang Mao, Kaohsiung (TW); Yufu Liu, Taoyuan (TW); Tsung Nan Lo, Taoyuan (TW); Wen Hung Huang, Kaohsiung (TW)

(73) Assignee: NXP B.V., Eindhoven (NL)

( * ) Notice: Subject to any disclaimer, the term of this patent is extended or adjusted under 35 U.S.C. 154(b) by 520 days.

(21) Appl. No.: 17/664,117

(22) Filed: May 19, 2022

(65) Prior Publication Data

US 2023/0378107 A1    Nov. 23, 2023

(51) Int. Cl.
| | | |
|---|---|---|
| H01L 23/00 | (2006.01) | |
| H01L 21/56 | (2006.01) | |
| H01L 23/31 | (2006.01) | |
| H01L 23/525 | (2006.01) | |
| H01L 23/528 | (2006.01) | |

(52) U.S. Cl.
CPC .............. *H01L 24/05* (2013.01); *H01L 21/56* (2013.01); *H01L 23/3171* (2013.01); *H01L 23/525* (2013.01); *H01L 23/5283* (2013.01); *H01L 24/03* (2013.01); *H01L 24/15* (2013.01); *H01L 2224/02311* (2013.01); *H01L 2224/0233* (2013.01); *H01L 2224/0401* (2013.01); *H01L 2924/014* (2013.01)

(58) Field of Classification Search
CPC ..... H01L 24/05; H01L 21/56; H01L 23/3171; H01L 23/525; H01L 23/5283; H01L 24/03; H01L 24/15; H01L 2224/02311; H01L 2224/0233; H01L 2224/0401; H01L 2924/014
See application file for complete search history.

(56) References Cited

U.S. PATENT DOCUMENTS

| | | |
|---|---|---|
| 6,077,726 A | 6/2000 | Mistry et al. |
| 6,593,220 B1 | 7/2003 | Yu et al. |
| (Continued) | | |

FOREIGN PATENT DOCUMENTS

JP    H 0513418 A    1/1993

OTHER PUBLICATIONS

Non Final Office Action; U.S. Appl. No. 17/664,113; 6 pages Apr. 11, 2024.

*Primary Examiner* — Michelle Mandala

(57) ABSTRACT

A semiconductor device package includes a semiconductor device and an electrically conductive pad disposed in contact with a surface of the semiconductor device. The semiconductor device package further includes a redistribution layer (RDL) formed over the electrically conductive pad and the surface of the semiconductor device, and an electrical connector disposed over and electrically coupled to the RDL. The RDL includes a first passivation layer disposed over a surface of the semiconductor device and the electrically conductive pad, and further includes an RDL trace. The RDL trace includes a first portion in contact with the electrically conductive pad, a second portion in contact with one of the electrical connector or an underlying metallization layer in contact with the electrical connector, and a third portion having a non-planar and undulating configuration relative to the surface of the semiconductor device.

20 Claims, 6 Drawing Sheets

(56) References Cited

U.S. PATENT DOCUMENTS

| | | | |
|---|---|---|---|
| 6,787,903 B2 | 9/2004 | Yang | |
| 7,968,445 B2 | 6/2011 | Lin et al. | |
| 9,871,013 B2 | 1/2018 | Tsai et al. | |
| 10,083,926 B1 | 9/2018 | Kent et al. | |
| 10,331,993 B1 | 6/2019 | Koepp et al. | |
| 10,811,347 B2 * | 10/2020 | Tu | H01L 23/49827 |
| 2004/0041393 A1 | 3/2004 | Lee | |
| 2004/0115902 A1 | 6/2004 | Hanaoka | |
| 2004/192024 A1 | 9/2004 | Ito | |
| 2005/0242427 A1 | 11/2005 | Yang | |
| 2007/0184643 A1 | 8/2007 | Rinne | |
| 2011/0316154 A1 | 12/2011 | Matsumoto | |
| 2013/0037933 A1 | 2/2013 | Jergovic et al. | |
| 2013/0147034 A1 | 6/2013 | Chen | |
| 2013/0241071 A1 | 9/2013 | Hsieh | |
| 2014/0131882 A1 | 5/2014 | Law et al. | |
| 2016/0322337 A1 * | 11/2016 | Liang | H01L 24/19 |
| 2018/0151525 A1 * | 5/2018 | Cheng | H01L 21/0217 |
| 2018/0233471 A1 * | 8/2018 | Yen | H01L 25/0657 |
| 2020/0035585 A1 | 1/2020 | Abraham et al. | |
| 2020/0051934 A1 * | 2/2020 | Lin | H01L 24/02 |
| 2020/0118918 A1 * | 4/2020 | Bang | H01L 23/3171 |
| 2022/0352133 A1 | 11/2022 | Luan | |
| 2023/0360917 A1 * | 11/2023 | Hsieh | H01L 21/28 |

\* cited by examiner

REDISTRIBUTION LAYER HAVING A SIDEVIEW ZIG-ZAG PROFILE

BACKGROUND

Wire bonding often is used to electrically couple a semiconductor device to a packaging substrate. However, the wire connections are typically limited to the outer permitter of the semiconductor device, which limits input/out (I/O) density. Also, the presence of wire bonds beyond the semiconductor device increases the area necessary for the final device package. Therefore, layers of dielectric material embedded with electrically conductive metal lines and vias, referred to as redistribution layers (RDL), are used to reroute wire bond connections from the edge to the center of the semiconductor device. After the RDL is formed, the device packaging process flow can continue using, for example, under bump metallization (UBM) instead of conventional wire bonding. In a UBM process, the metallization is deposited on the top metal level of the semiconductor device and solder metal is used to directly connect the semiconductor device to the packaging substrate. The connection points between the device and the packaging substrate are distributed over the entire top surface of the chip, which increases the I/O density by using a higher percentage of the semiconductor device surface area for connection to the packaging substrate. As such, RDLs can be used to maintain existing package designs while accommodating the smaller die produced by semiconductor manufacturers transitioning to advanced technology nodes.

SUMMARY OF EMBODIMENTS

In accordance with one aspect, a semiconductor device package includes a semiconductor device, a first passivation layer disposed over a surface of the semiconductor device, and a redistribution layer (RDL) trace disposed in physical contact with the first passivation layer. The RDL trace includes a non-planar configuration relative to the surface of the semiconductor device, wherein the non-planar configuration includes a first area of the RDL trace having a first height and a second area of the RDL trace having a second height different than the first height.

The semiconductor device package may include one or more of the following features, individually or in combination: the non-planar configuration includes at least one peak and at least one valley in the RDL trace; an electrically conductive pad disposed below the first passivation layer and in electrical contact with the semiconductor device and the RDL trace; a second passivation layer disposed above and in physical contact with the RDL trace; an electrical connector disposed above and electrically coupled to the RDL trace; a metallization layer disposed between the RDL trace and the electrical connector, wherein a first surface of the metallization layer physically contacts the RDL trace, and a second surface of the metallization layer physically contacts the electrical connector; a third passivation layer in physical contact with the surface of the semiconductor device and a bottom surface of the first passivation layer, and further in physical contact with the electrically conductive pad; wherein the RDL trace includes a first portion in physical contact with the electrically conductive pad, a second portion in physical contact with the electrical connector, and a third portion comprising the non-planar configuration, wherein the third portion is disposed between the first portion and the second portion of the RDL trace; or wherein a first surface of the third portion of the RDL trace transitioning from a first area to a second area of the RDL trace includes is sloped such that a first obtuse angle is formed between the first area and the second area, and wherein a second surface of the third portion of the RDL trace transitioning from the second area to a third area of the RDL trace is also sloped such that a second obtuse angle is formed between the second area and third area.

In accordance with another aspect, a semiconductor device package includes a semiconductor device, an electrically conductive pad disposed in electrical contact with the semiconductor device, a redistribution layer (RDL) formed over the electrically conductive pad, and an electrical connector disposed over and electrically coupled to the RDL. The RDL includes a first passivation layer disposed over a surface of the semiconductor device and the electrically conductive pad, and RDL trace having a first portion in physical contact with the electrically conductive pad, a second portion in physical contact with one of the electrical connector or an underlying metallization layer in physical contact with the electrical connector, and a third portion including a non-planar and undulating configuration relative to the surface of the semiconductor device.

The semiconductor device package may include one or more of the following features, individually or in combination: the non-planar and undulating configuration includes at least one peak and at least one valley in the RDL trace; wherein the at least one peak is disposed in at least a first area of the third portion of the RDL trace and the at least one valley is disposed in at least a second area of the third portion of the RDL trace, and wherein a surface of the RDL trace transitioning from the first area to the second area is sloped such that an obtuse angle is formed between the first area and the second area; wherein the semiconductor device package further includes a second passivation layer disposed on and in physical contact with the RDL trace; wherein the metallization layer is disposed within an opening formed in the second passivation layer; wherein the metallization layer is disposed between the RDL trace and the electrical connector, wherein a first surface of the metallization layer physically contacts the RDL trace, and a second surface of the metallization layer physically contacts the electrical connector; or another passivation layer in physical contact with the surface of the semiconductor device and a bottom surface of the first passivation layer, and further in physical contact with the electrically conductive pad.

In accordance with yet another aspect, a method of fabricating a semiconductor device package includes forming a first passivation layer over a surface of an underlying semiconductor device; patterning the first passivation layer, wherein the patterning forms a first non-planar and undulating configuration in a portion of the first passivation layer relative to the surface of the semiconductor device; and forming a redistribution layer (RDL) trace in physical contact with the patterned first passivation layer, wherein the RDL trace includes a second non-planar and undulating configuration relative to the surface of the semiconductor device and conforming to the first non-planar and undulating configuration.

The method of fabricating the semiconductor device package may include one or more of the following features, individually or in combination: patterning the first passivation layer using at least one of a grayscale mask or a multi-exposure process; wherein patterning the first passivation layer forms a trench in the first passivation layer that exposes an electrically conductive pad in contact with the semiconductor device. wherein forming the RDL trace includes forming a first portion of the RDL trace in the trench and in contact with electrically conductive pad, forming a second portion of the RDL trace opposite the first portion of the RDL trace, and forming a third portion of the RDL trace between the first portion and the second portion, wherein the third portion of the RDL trace comprises the second non-planar and undulating configuration; forming a second passivation layer on and in contact with the RDL trace, forming a trench in the second passivation layer exposing a portion of the RDL trace, and forming an electrical connector in electrical contact with the exposed portion of the RDL trace; or wherein the first non-planar and undulating configuration and the second non-planar and undulating configuration each comprise at least one peak and at least one valley.

BRIEF DESCRIPTION OF THE DRAWINGS

The present disclosure is better understood, and its numerous features and advantages made apparent to those skilled in the art, by referencing the accompanying drawings. The use of the same reference symbols in different drawings indicates similar or identical items.

DETAILED DESCRIPTION

Figure 1:
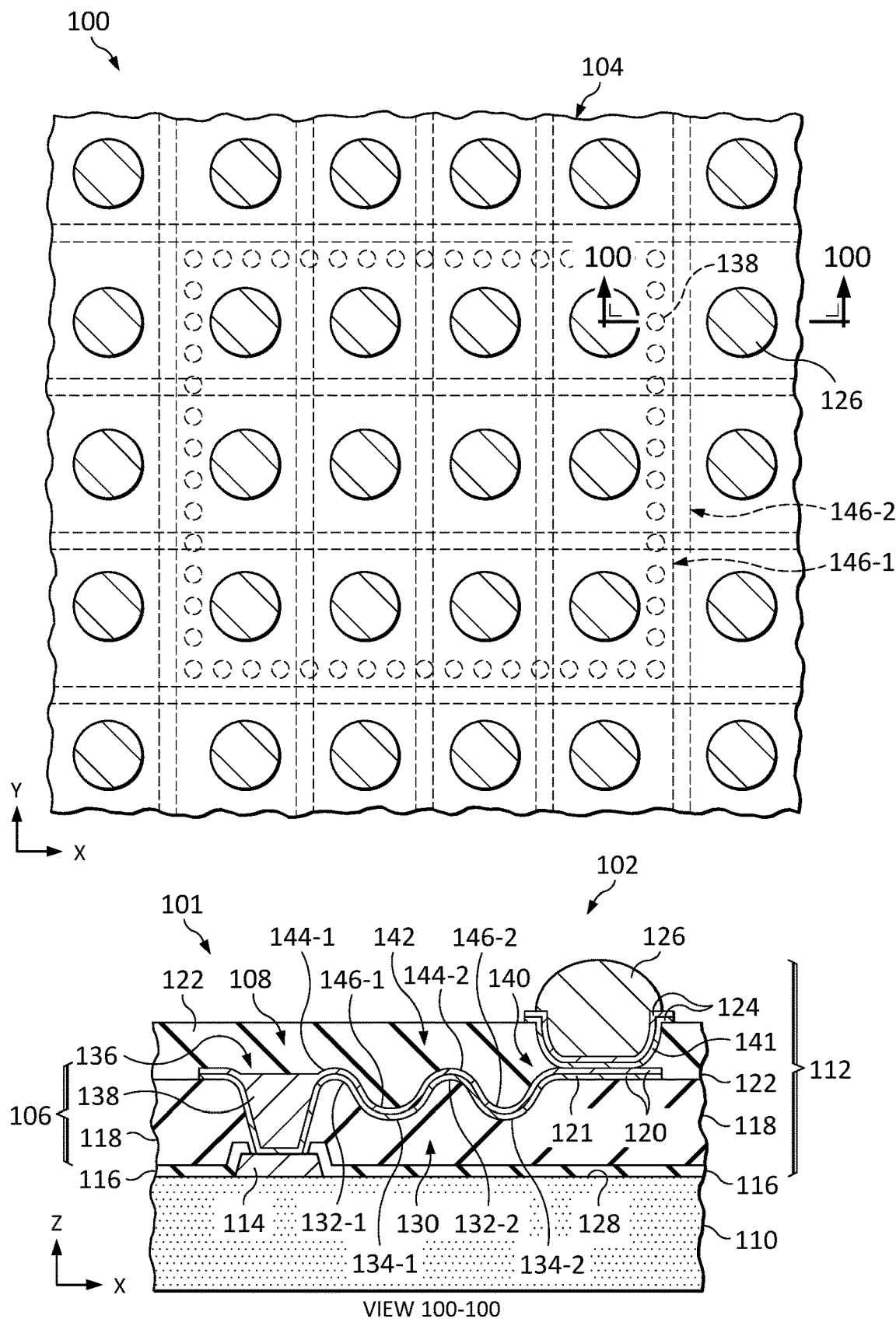
FIG. 1 is a top view of a semiconductor device package and a cross-section view 102 of a portion of the semiconductor device package implementing a non-planar redistribution layer configuration in accordance with one or more embodiments.

Redistribution layers (RDLs) are commonly implemented in many semiconductor packaging technologies, such as ball grid array (BGA) packaging, chip-scale packaging (CSP), wafer-level packaging (WLP), panel-level packaging, three-dimensional (3D) packaging, system-in-a-package (SiP), and the like. RDLs interface between the underlying semiconductor device and electrical bumps (e.g., solder bumps) of the package so that signals are routed appropriately between the bumps and the active circuitry of the semiconductor device. Stated differently, RDLs reroute input/output (I/O) pads of an originally designed circuit via a wafer-level metal distribution process and a micro bump process so that the circuitry can be adapted for different packaging forms.

Conventional RDL configurations are typically planar (straight) and formed by depositing a passivation layer including an insulating dielectric material (e.g., polyimide) onto a finished back-end-of-line (BEOL) structure at wafer level, and then forming a new level of redistribution wiring/traces either in aluminum or copper metallization using standard BEOL processing. As part of the BEOL processing, a trench is usually formed in the passivation layer to expose an underlying conducting pad. The metalized RDL trace is formed and patterned in contact with the passivation layer and the exposed portion of the conducting pad. The RDL trace is then coated with another passivation layer including an insulating dielectric material (e.g., polyimide) through which the interconnect openings for solder bump connections are formed. conventional planar RDL trace configurations can be susceptible to poor adhesion resulting from, for example, the difference between the thermal properties of the passivation layers and the RDL trace, which leads to problems such as delamination and cracking. Also, conventional planar RDL trace configurations tend to be susceptible to stresses resulting from the various packaging layers and the planar configuration of the RDL trace itself, which can lead to the RDL trace becoming damaged or broken.

As such, described herein is a non-planar RDL trace configuration and method for forming the same that can mitigate the aforementioned issues associated with planar RDL trace configurations. The non-planar RDL trace configuration comprises a hilling topography, which includes one or more peaks having a first height and one or more valleys having a second height different from the first height. The hilling topography is formed, for example, using a gradient grayscale mask or a multi-exposure process that forms a peak and valley pattern in a passivation layer overlying a semiconductor device. This process also forms a trench/opening in the passivation layer exposing an electrically conductive pad(s), such as a bonding pad, underlying the passivation layer. An electrically conductive material, such as copper, titanium, tungsten, aluminum, or the like, an alloy of two or more such materials, or any suitable combination of electrically conductive materials is deposited over the patterned passivation layer and fills the trench. The electrically conductive material is patterned to form an RDL trace including a first portion in contact with the bond pad and a second portion, opposite the first portion, configured to receive either an electrical bump (e.g., solder bump/ball) or a combination of UBM and an electrical bump. As the RDL trace conforms to the patterned passivation layer, a third portion of the RDL trace, which is disposed between the first and second portions of the RDL trace, comprises a non-planar configuration having a peak and valley pattern. In one or more embodiments, the non-planar configuration of the RDL trace is characterized as a "zig-zag" or "folding" pattern when taken across the longitudinal axis of the RDL trace along a plane orthogonal to the underlying surface of the semiconductor device. The non-planar configuration of the RDL trace provides an increased stress buffer along the stretching direction (i.e., longitudinal axis) of the RDL trace compared to a conventional planar (straight) RDL trace configuration. The increased stress buffer can avoid, or at least mitigate, rapid stress accumulation in the RDL trace. Moreover, the non-planar configuration of the RDL trace can increase the contact area between the RDL trace and underlying/overlying passivation layers compared to the conventional planar RDL trace configuration. The increased contact area can provide for improved interlayer adhesion between the RDL trace and underlying/overlying passivation layers. Also, the "zig-zag" pattern of the non-planar RDL trace configuration can increase the electroplating charging path when forming the RDL trace compared to the conventional planar configuration, which can improve plating thickness uniformity.

Note that in the following, certain orientational terms, such as top, bottom, front, back, and the like, are used in a relative sense to describe the positional relationship of various components. These terms are used with reference to the relative position of components either as shown in the corresponding figure or as used by convention in the art and are not intended to be interpreted in an absolute sense with reference to a field of gravity. Thus, for example, a surface shown in the drawing and referred to as a top surface of a component would still be properly understood as being the top surface of the component, even if, in implementation, the component was placed in an inverted position with respect to the position shown in the corresponding figure and described in this disclosure. Further, note that certain positional terms, such as co-planar or parallel, will be understood to be interpreted in the context of fabrication tolerances or industry standards. For example, co-planar shall be understood to mean co-planar within applicable tolerances as a result of one or more fabrication processes affecting the components indicated to be co-planar, or co-planar within a tolerance utilized in the appropriate industry or fabrication technology. Moreover, it will be appreciated that for simplicity and clarity of illustration, components shown in the figures have not necessarily been drawn to scale. For example, the dimensions of some of the components may be exaggerated relative to other components.

It also should be noted that the terms "contact", "contacts", "contacting", or their equivalents refer to, for example, components, such as layers, features, or surfaces being in physical (direct) contact or indirect contact through one or more intermediate layers, features, or surfaces, or the like. Moreover, a component can be in "electrical contact" with one or more other components, either directly or indirectly through one or more intermediate components, depending on the electrical conductivity of the components' material(s). Also, the term "metal" as used herein shall be understood to refer to an elemental metal (e.g., copper (Cu) or nickel (Ni)), a metal alloy (e.g., a copper-nickel alloy), a combination of metals, a combination of metal alloys, or a combination of one or more metals and one or more metal alloys (e.g., a copper layer with a copper-nickel-palladium plating).

FIG. 1 illustrates a top view 100 of a semiconductor device package 104 and a cross-section view 102 of a portion 101 of the semiconductor device package 104 implementing a non-planar configuration 108 for an RDL trace in accordance with one or more embodiments. The cross-section view 102 is taken along the illustrated x-axis of the semiconductor device package 104 at cut line 100-100 corresponding to the longitudinal axis of the semiconductor package portion 101. It should be understood that one or more layers shown in the cross-section view 102 are not shown in the top view 100 for illustrative purposes. It should also be understood that although the following description uses wafer-level packaging as one example of a packaging technique, other packaging techniques are applicable as well, such as panel-level packaging, other chip-scale packaging (CSP), ball grid array (BG) packaging, three-dimensional (3D) packaging, system-in-a-package (SiP), and the like. Also, although a 2P2M (two dielectric polymer re-passivation, 1 RDL metal, 1 UBM metal) packaging configuration is illustrated in the figures, the RDL configurations and techniques described herein are also applicable to other packaging configurations, such as 2P1M (two dielectric polymer re-passivation and 1 RDL metal).

As illustrated, the semiconductor device package 104 comprises a semiconductor device/chip 110 and packaging layers 112 formed thereon. In one or more embodiments, the packaging layers 112 include an electrically conductive pad(s) 114 (e.g., a bonding pad), a first passivation layer 116, an RDL 106 comprising at least a second passivation layer 118 and one or more RDL traces 120, a third passivation layer 122, a UBM layer(s) 124, and an electrical connector(s)/bump(s) 126 (e.g., solder ball/bump). The second passivation layer 118 and the third passivation layer 122 are also referred herein as the "first re-passivation layer 118" and the "second re-passivation layer 122", respectively. In one or more embodiments, at least one of these features comprise a single layer while, in other embodiments, one or more of these features comprise multiple layers. Also, in one or more embodiments, at least one of these features/layers, such as the UBM layer(s) 124 or one of the re-passivation layers 118 or 122, may be omitted.

Figure 2:
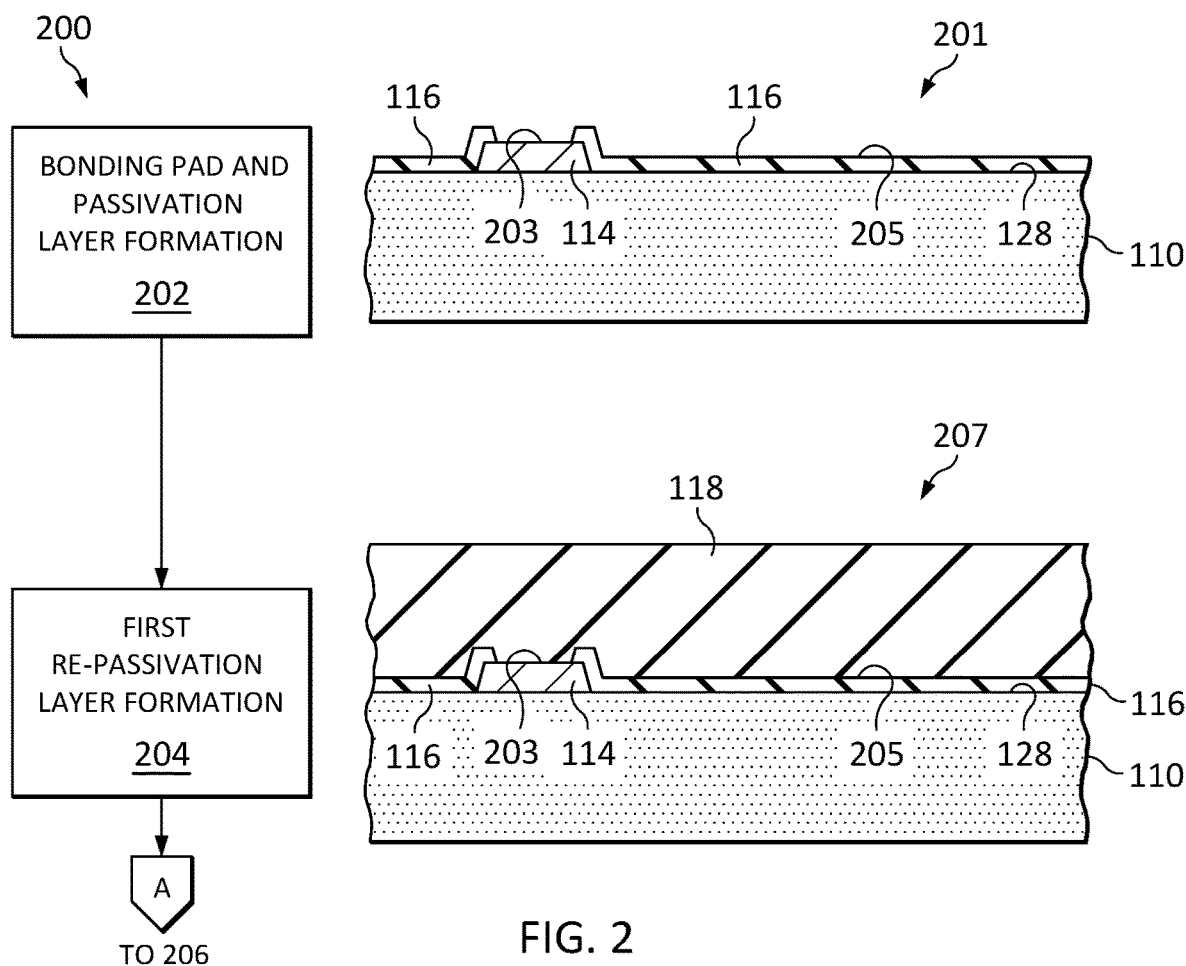
FIG. 2 illustrates a method for fabricating a semiconductor package implementing a non-planar redistribution layer including processes for forming a passivation layer and a first re-passivation layer in accordance with one or more embodiments.

The electrically conductive pad 114, in one or more embodiments, contacts a portion of the underlying surface 128 surface of the semiconductor device 110. In this example, the underlying surface 128 can also be referred to as the top surface 128 of the semiconductor device 110. The electrically conductive pad 114 comprises an electrically conductive material, such as gold, aluminum, copper, the like, or a combination thereof. The passivation layer 116 is disposed in contact with the top surface 128 of the semiconductor device 110, sidewalls of the electrically conductive pad 114, and a portion of the top surface 205 (FIG. 2) of the electrically conductive pad 114. The passivation layer 116 comprises a material such as nitride, oxide, polybenzoxazole (PBO), benzocyclobutene (BCB), polyimide (PI), or any other suitable passivation material. In one or more embodiments, an adhesion layer (not shown) is formed in place of, or in addition, to the passivation layer 116 to promote improved adhesion between the overlying re-passivation layer 118 and underlying semiconductor device 110.

The first re-passivation layer 118 (or other dielectric layer) is disposed in contact with a top surface 205 (FIG. 2) of the passivation layer 116. In one or more embodiments, the first re-passivation layer 118 also contacts the top surface 205 (FIG. 2) of the electrically conductive pad 114. A portion 130 of the first re-passivation layer 118 comprises a hilling topography 209 (FIG. 2) including peaks 132 (illustrated as peak 132-1 and peak 132-2) and valleys 134 (illustrated as valley 134-1 and valley 134-2). The peaks 132 are defined as having their top surface disposed closer to the top surface of the first re-passivation layer 118 than the top surface of the valleys 134, and the valleys 134 are defined as having their top surface disposed closer to a bottom surface of the first re-passivation layer 122 than the top surface of the peaks 132. In this example, the bottom surface of the first re-passivation layer 118 is the surface of the first re-passivation layer 118 closest to the semiconductor device 110. Also, the surface of the first re-passivation layer 118 that transitions from a peak 132 to a valley 134, and vice versa, is sloped such that the height of each peak 132 is different than the height of each valley 134 relative to either the top surface or bottom surface of the first re-passivation layer 118 and these height changes are continuous across the portion 130 of the first re-passivation layer 118. In one or more embodiments, the sloping surface forms an obtuse angle between the peak 132 and the valley 134. The first re-passivation layer 118 comprises one or more materials such as polymer-based materials (PI, PBO, BCB, or the like), epoxy-based materials, or any other suitable insulating passivation material.

The RDL trace 120 is disposed in contact with the first passivation layer 118 and the electrically conductive pad 114. The RDL trace 120 comprises an electrically conductive material, such as copper, titanium, tungsten, aluminum, the like, or a combination thereof. In one or more embodiments, the RDL trace 120 includes or is formed on an underlying seed layer 121, comprised of a metal, such as titanium, copper, gold, a combination thereof, or the like. In one or more embodiments, a first portion 136 of the RDL trace 120 fills a trench/opening 217 (FIG. 3) in the first re-passivation layer 118 and forms a via 138 in contact with the electrically conductive pad 114. A second portion 140 of the RDL trace 120, which is disposed opposite the first portion 136, is configured to receive the electrical bump 126 and any UBM layer 124. A third portion 142 of the RDL trace 120 is disposed between the first portion 136 and the second portion 140 of the RDL trace 120 and comprises a non-planar configuration 108 relative to the illustrated z-axis. The non-planar configuration 108 conforms to the hilling topography of the underlying first re-passivation layer 118. As such, the non-planar configuration 108 comprises one or more peaks 144 (such as the illustrated peak 144-1 and peak 144-2) and one or more valleys 146 (such as the illustrated valley 146-1 and valley 146-2) forming a "zig-zag" or "folding" pattern relative to a plane orthogonal to the underlying surface 128 of the semiconductor device 110, as shown in the cross-section view 102 of FIG. 1. The peaks 144 are defined as having their top surface disposed closer to the top surface of the RDL 106 than the top surface of the valleys 146, and the valleys 146 are defined as having their top surface disposed closer to a bottom surface of the RDL 106 than the top surface of the peaks 144. In this example, the bottom surface of the RDL 106 is the surface of the RDL 106 closest to the semiconductor device 110. Also, the surface of the RDL trace 120 that transitions from a peak 144 to a valley 146, and vice versa, is sloped such that the height of each peak 144 is different than the height of each valley 146 relative to either the top surface or bottom surface of the RDL 106 and these height changes are continuous across the third portion 142 of the RDL trace 120. In one or more embodiments, the sloping surface forms an obtuse angle between the peak 144 and the valley 146. An example range of the height difference (or thickness of the first re-passivation layer 118) between a peak 146 and a valley 146 is 2 to 5 micrometers or greater. Thus, as illustrated, the RDL trace 120 may take on an undulating or quasi-sinusoidal profile relative to the illustrated Z-X plane for at least a portion of its lateral extent. In one example, the thickness of the first re-passivation layer 118 at the location of an RDL valley 146 is 5 micrometers or greater, although lesser thicknesses are applicable as well.

The second re-passivation layer 122 (or other dielectric layer) is disposed in contact with exposed surfaces of the RDL trace 120. In one or more embodiments, the second re-passivation layer 122 also contacts portions of the first re-passivation layer 118 that are not covered by the RDL trace 120. The topography of the second re-passivation layer 122, in one or more embodiments, confirms to the topography of the RDL trace 120. In one or more embodiments, the second re-passivation layer 122 comprises material(s) that are the same or different than the material(s) of the first re-passivation layer 118, such as polymer-based materials (PI, PBO, BCB, or the like), epoxy-based materials, or any other suitable insulating passivation material. In one example, the thickness of the second re-passivation layer 122 at the location of an RDL peak 144 is 5 micrometers or greater, although lesser thicknesses are applicable as well.

The UBM layer 124 is disposed within and conforms to a trench 239 (FIG. 5) formed in the second re-passivation layer 122 and contacts the second portion 140 of the RDL trace 120. In one or more embodiments, a portion(s) 154 of the UBM layer 124 extends above/over and contacts the top surface 243 (FIG. 6) of the second re-passivation layer 122. The UBM layer 124 is composed of a single layer or multiple layers and comprises one or more electrically conductive materials, such as copper, titanium, gold, tungsten, nickel, chrome, or the like, an alloy of two or more such materials, or any suitable combination of electrically conductive materials. In one or more embodiments, the UBM layer 124 includes or is formed on an underlying seed layer 141, comprised of a metal, such as titanium, copper, gold, or the like, an alloy of two or more such materials, or any suitable combination of metals. The electrical bump 126 is disposed in contact with the UBM layer 124 or in contact with the second portion 140 of the RDL trace 120 if the UBM layer 124 is not formed. In one or more embodiments, the electrical bump 126 fills a cavity defined by the inner sidewalls and the inner bottom surface of the UBM layer 124. The electrical bump 126 further contacts portion(s) of the UBM layer 124 extending above/over and contacting the top surface 237 (FIG. 5) of the second re-passivation layer 122. The electrical bump 126 comprises an electrically conductive material, such as copper, solder, aluminum, gold, nickel, silver, palladium, tin, or the like, an alloy of two or more such materials, or any suitable combination of electrically conductive materials.

In the configuration shown in FIG. 1, the electrical bump 126 is electrically coupled to the electrically conductive pad 114 by the RDL trace 120. Because the non-planar configuration 108 of the RDL trace 120 is disposed between the signal input (i.e., the electrically conductive pad 114 and via 138) and the signal output (e.g., electrical bump 126) of the semiconductor device package 104, the non-planar configuration 108 provides increased stress buffering and relaxation for the RDL electrical interconnections compared to a conventional planar (straight) RDL trace configuration regardless of whether a single or multiple RDL traces are implemented. Moreover, the non-planar configuration of the RDL trace 120 increases the contact area between the RDL trace and underlying/overlying passivation layers compared to the conventional planar RDL trace configuration, which provides for improved interlayer adhesion between the RDL trace 120 and underlying/overlying re-passivation layers 118 and 122. The increased contact area further increases the electroplating charging path when forming the RDL trace 120 compared to the conventional planar configuration, which improves plating thickness uniformity.

FIG. 2 to FIG. 6 together illustrate a method 200 for fabricating a semiconductor device (e.g., an integrated circuit) package implementing a non-planar configuration for an RDL trace(s) in accordance with at least one embodiment of the present disclosure. For ease of illustration, the method 200 is described in the example context of fabrication of the semiconductor device package 104 of FIG. 1 but is not limited to this example description.

The method 200 begins at block 202 with the fabrication of an initial workpiece 201 by forming the passivation (or adhesion) layer(s) 116 on and in contact with a top surface 128 of the semiconductor device 110. The passivation layer 116 is also formed over and in contact with at least a portion of the electrically conductive pad(s) 114. In one or more embodiments, the passivation layer 116 is formed by depositing a passivation material using chemical vapor deposition (CVD), plasma enhanced CVD (PECVD), atmospheric pressure chemical vapor deposition (APCVD), low pressure chemical vapor deposition (LPCVD), laser assisted chemical vapor deposition (LACVD), photo assisted chemical vapor deposition (PACVD), or the like. The passivation material includes, for example, nitride, oxide, PBO, BCB, PI, or any other suitable passivation material. Suitable patterning, developing, and etching processes can then be performed to pattern the passivation material to define the passivation layer 116. These processes (or additional processes) also form an opening in the passivation layer 116 to expose at least a portion of a top surface 205 of the electrically conductive pad 114.

At block 204, the first re-passivation layer 118 is formed over the electrically conductive pad 114 and the passivation layer 116, thereby forming modified workpiece 207. The first re-passivation layer 118 contacts the top surface 205 of the passivation layer 116 and at least the top surface 203 of the electrically conductive pad 114. In one or more embodiments, the first re-passivation layer 118 is formed by depositing a passivation material using, for example, CVD, PECVD, APCVD, LPCVD, LACVD, PACVD, spin coating, lamination, or the like over the initial workpiece 201. The passivation material includes, for example, passivation layer 116 comprises a material such as nitride, oxide, polymer-based materials (PI, PBO, BCB, or the like), epoxy-based materials, or any other suitable insulating passivation material.

Figure 3:
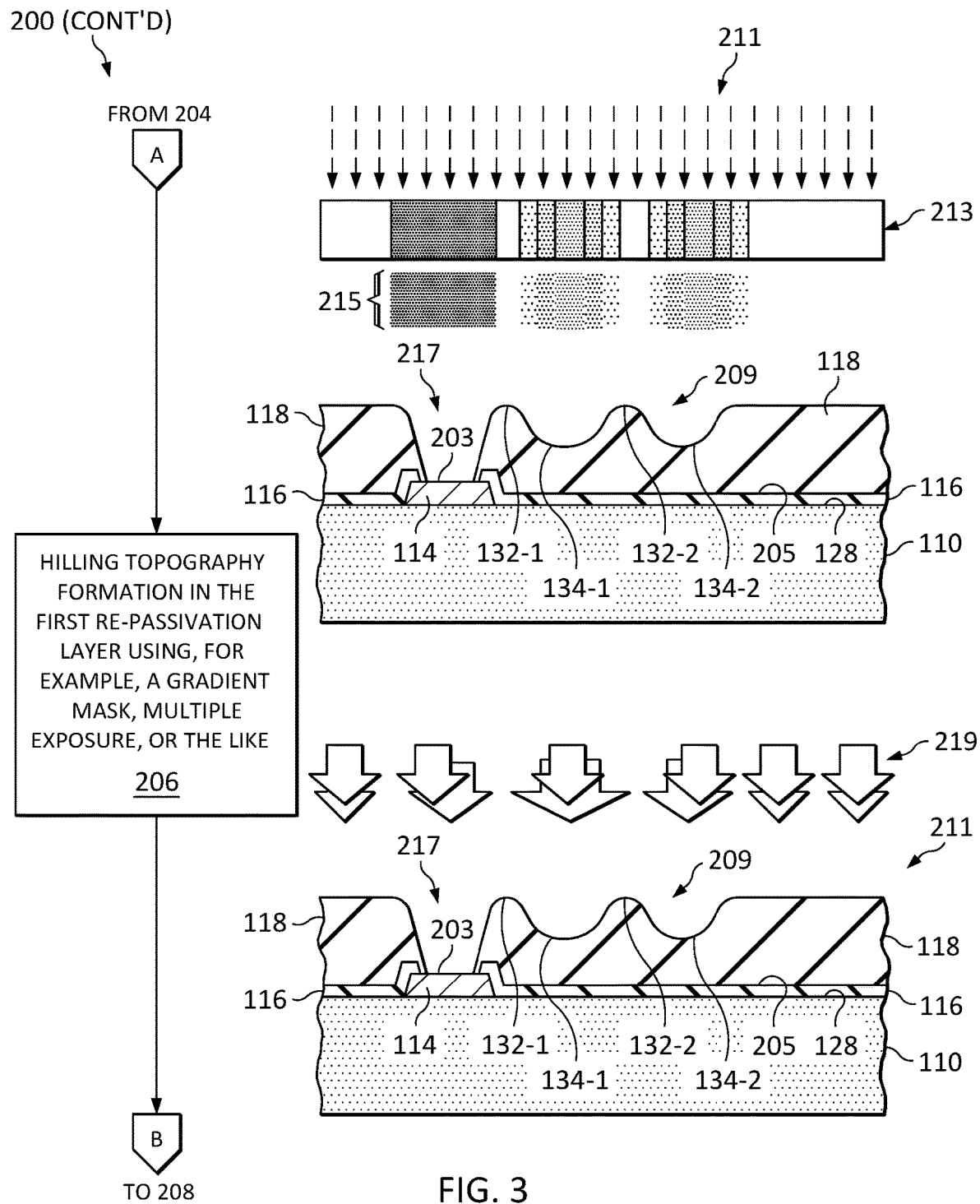
FIG. 3 illustrates a continuation of the method started in FIG. 2 including processes for forming a hilling topography in the first re-passivation layer in accordance with one or more embodiments.

Turning to FIG. 3, the method 200 continues at block 206 with one or more lithography processes to form a hilling topography 209 in the first re-passivation layer 118, resulting in modified workpiece 211. In one example, the hilling topography 209 is formed using a gradient/grayscale lithography process. In this example, the first re-passivation layer 118 comprises an ultraviolet (UV) light curable material that is exposed using a photomask 213 having a gradient/grayscale design, which is represented by the varying white, black, and gradient patterns in the photomask 213. The grayscale design of the photomask 213 allows different intensities/levels of ultraviolet (UV) light 215 to pass through the photomask 213, thereby generating areas of different crosslink densities in the first re-passivation layer 118. For example, a black area of the photomask 213 indicates this portion of the photomask 213 is completely shielding, i.e., 0% of UV light 215 passes through the photomask 213. A white area of the photomask 213 indicates this portion of the photomask 213 is completely transparent, i.e., 100% of UV light 215 passes through the photomask 213. A lighter patterned area of the photomask 213 allows more UV light 215 to pass through the photomask 213 than a darker patterned area. After exposure, a developing process is performed, and the exposed areas of the first re-passivation layer 118 with a higher cross-link density have no or less material removed compared to areas with lower cross-link density, or vice versa, depending on if the photomask 213 comprises a negative tone material or a positive tone material. The result of this process is the hilling topography 209 comprising the peaks 132 and valleys 134 described above with respect to FIG. 1. Also, the lithography process also forms a trench/opening 217 in the first re-passivation layer 118 that exposes at least a portion of the electrically conductive pad's top surface 203. The developed portions of the photomask 213 are then cured using a baking process.

In another example, a UV curable photoresist is formed over the first re-passivation layer 118 and the hilling topography 209 is first formed in the photoresist using the photomask 213. The hilling topography 209 is then formed in the first re-passivation layer 118 using, for example, reactive ion etching (RIE). In yet another example, a multiple exposure patterning process 219, which uses two or more photolithographic sub-processes, is performed to form the hilling topography 209 in the first re-passivation layer 118.

Figure 4:
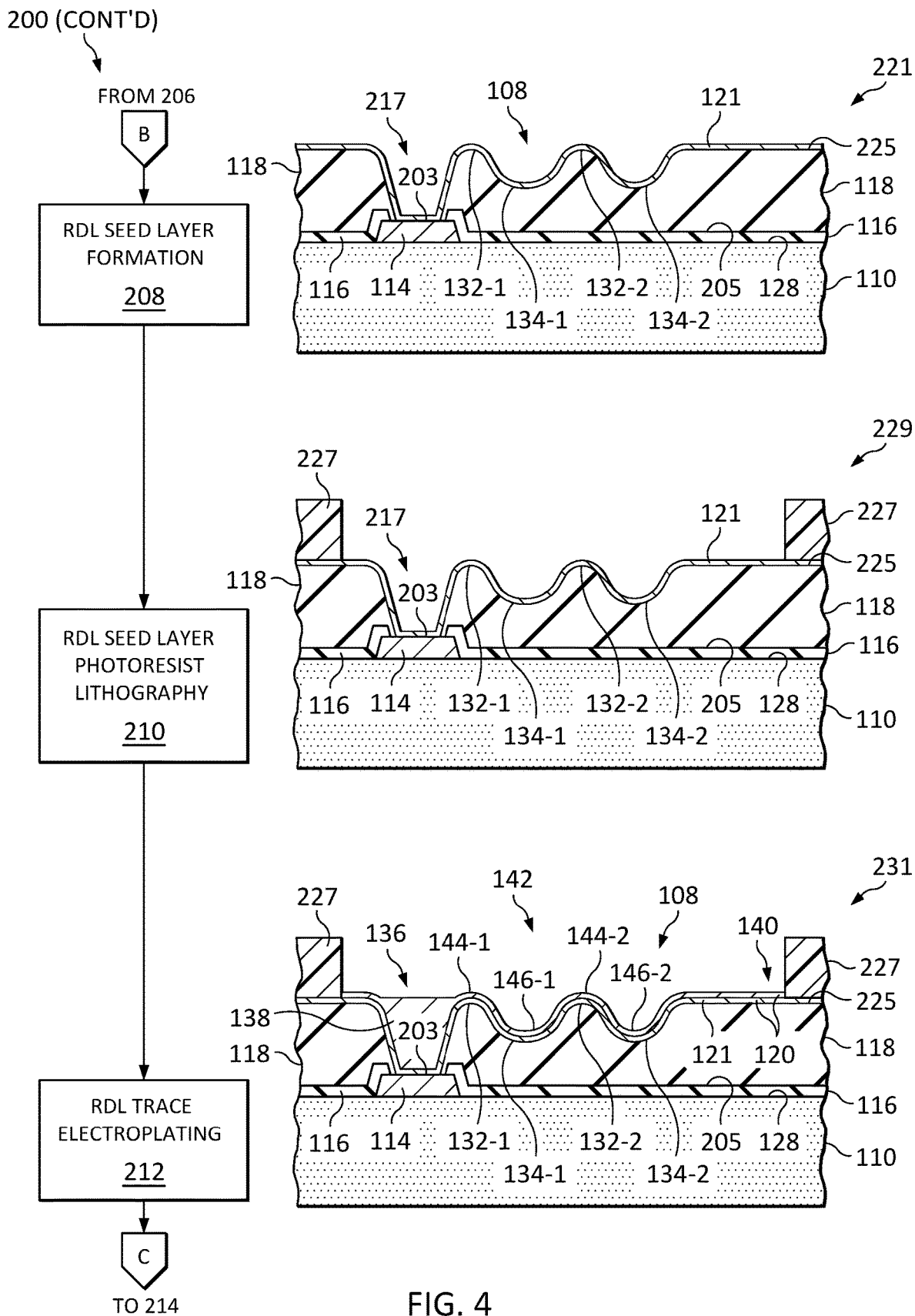
FIG. 4 illustrates a continuation of the method illustrated in FIG. 2 and FIG. 3 including processes for forming redistribution layer having a non-planar configuration in accordance with one or more embodiments.

Turning to FIG. 4, the method 200 continues at block 208 with one or more deposition processes to form an RDL seed layer 121, resulting in modified workpiece 221. For example, the RDL seed layer 121 is formed on the first re-passivation layer 118 and in the trench 217. The RDL seed layer 121, in one or more embodiments, conforms to and contacts a top surface 225 of the first re-passivation layer 118, sidewalls of the trench 217, and the exposed top surface 203 of the electrically conductive pad 114. As such, the RDL seed layer 121 has the non-planar configuration 108 described above with respect to FIG. 1. In one or more embodiments, the RDL seed layer 121 is a metal layer and is comprised of a single layer or a composite layer comprising a plurality of sub-layers formed of different materials. PVD or another process can be used to deposit an electrically conductive material to form the seed layer 121, such as titanium, copper, gold, or the like, an alloy of two or more such materials, or any suitable combination of electrically conductive materials.

At block 210, a mask 227, such as a photoresist layer, is formed and patterned on the RDL seed layer 121 in accordance with a desired redistribution pattern, resulting in modified workpiece 229. Patterning is performed to form openings through the mask 227 to expose the seed layer 121. At block 212, the RDL trace 120 is formed, resulting in modified workpiece 231. For example, an electrically conductive material is formed in the openings of the mask 227 and on the exposed portions of the RDL seed layer 121. A process such as plating, e.g., electroplating or electroless plating, or another process(es) is performed to form the electrically conductive material. In one or more embodiments, the electrically conductive material comprises a metal, such as copper, titanium, tungsten, aluminum, or the like, an alloy of two or more such materials, or any suitable combination of electrically conductive materials. The RDL trace 120, in one or more embodiments, comprises both the seed layer 121 and the electrically conductive material deposited thereon. The first portion 136 of the RDL trace 120 fills the trench 217, thereby forming the via 138 in contact with the electrically conductive pad 114. The second portion 140 of the RDL trace 120, which is disposed opposite the first portion 136, is configured to receive a subsequently formed UBM layer 124 and electrical bump 126. The third portion 142 of the RDL trace 120 is disposed between the first portion 136 and the second portion 140 of the RDL trace 120 and comprises the non-planar configuration 108. As described above with respect to FIG. 1, the non-planar configuration 108 comprises peaks 144 and valleys 146 forming a "zig-zag" or "folding" pattern.

Figure 5:
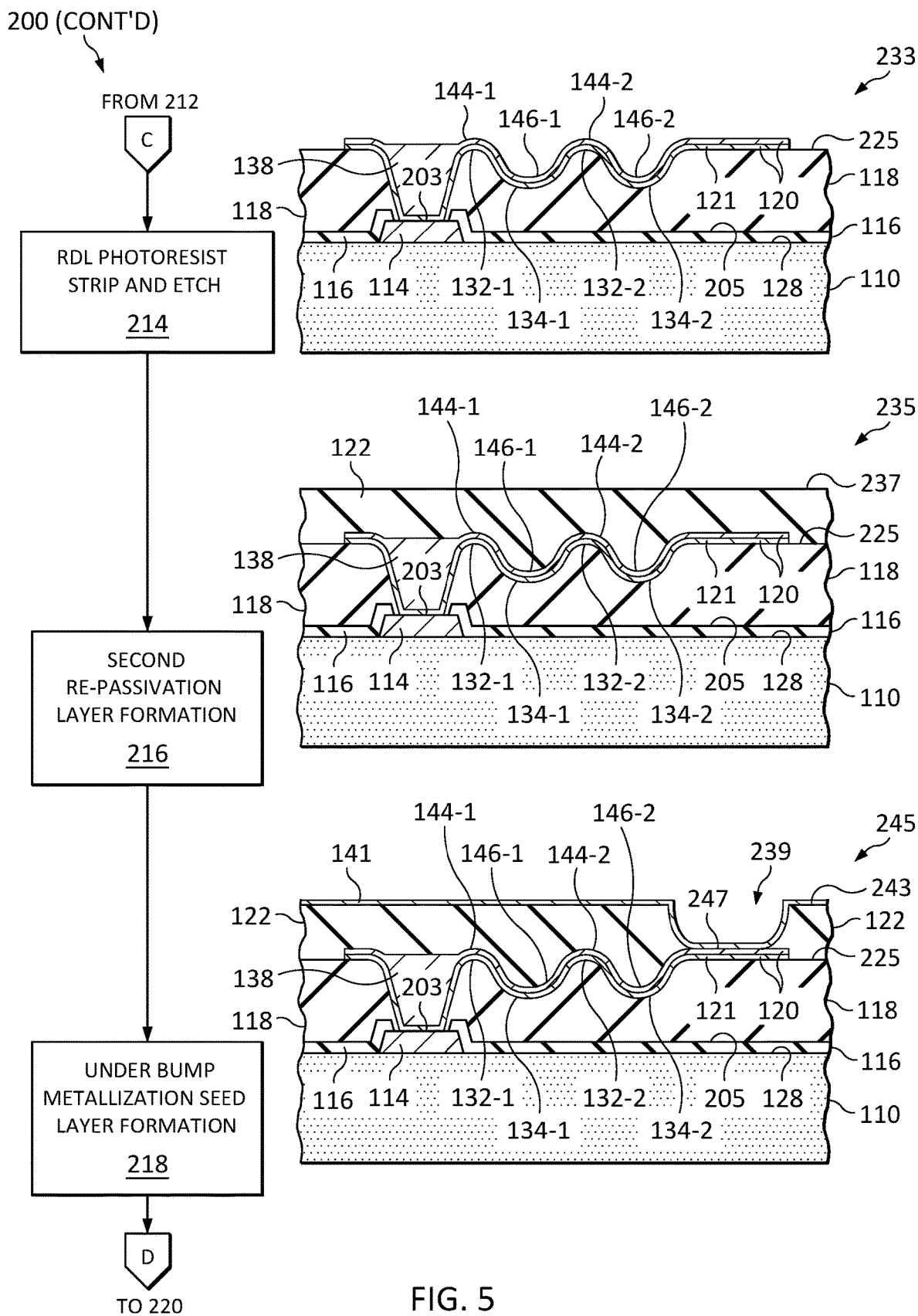
FIG. 5 illustrates a continuation of the method illustrated in FIG. 2 to FIG. 4 including processes for patterning the redistribution layer, forming a second re-passivation layer, a seed layer for under bump metallization in accordance with one or more embodiments.

Turning to FIG. 5, the method 200 continues at block 214 with the removal of the mask 227 and portions of the RDL seed layer 121 on which the electrically conductive material is not formed, resulting in modified workpiece 233. The mask 227 is removed using an acceptable process, such as an ashing process or stripping process. Once the mask 227 is removed, the exposed portions of the RDL seed layer 121 are removed using an acceptable process, such as an etching process include wet etching, dry etching, or the like.

At block 216, the second re-passivation layer 122 is formed over and in contact with the RDL trace 120 and any exposed surface of the first re-passivation layer 118, resulting in modified workpiece 235. In one or more embodiments, the second re-passivation layer 122 is formed by depositing a passivation material using, for example, CVD, PECVD, APCVD, LPCVD, LACVD, PACVD, spin coating, lamination, or the like over the initial workpiece 201. The passivation material includes, for example, a material such as such as nitride, oxide, polymer-based materials (PI, PBO, BCB, or the like), epoxy-based materials, or any other suitable insulating passivation material. The second re-passivation layer 122 comprises the same or different material than the first re-passivation layer 118. A planarization process, such as chemical mechanical polish (CMP), can be performed to planarize the top surface 237 of the second re-passivation layer 122.

At block 218, a trench/opening 239 is formed the second re-passivation layer 122 and a UBM seed layer 241 is formed in the trench 239 and on the top surface 243 of the second re-passivation layer 122, resulting in modified workpiece 245. In one or more embodiments, the trench 239 in the second re-passivation layer 122 is formed by forming a photoresist (not shown) over the top surface 243 of the second re-passivation layer 122, patterning the photoresist, and etching the second re-passivation layer 122 through the patterned photoresist using a suitable etching process (e.g., a wet etching process, a dry etching process, or the like. The trench exposes a top surface 247 of the second portion 140 of the RDL trace 120. In one or more embodiments, the UBM seed layer 241 is a metal layer and is comprised of a single layer or a composite layer comprising a plurality of sub-layers formed of different materials. PVD or another process can be used to deposit an electrically conductive material to form the UBM seed layer 241, such as titanium, copper, gold, a combination thereof, or the like. The UBM seed layer 241, in one or more embodiments, conforms to and contacts the top surface 243 of the second re-passivation layer 122, sidewalls of the trench 239, and the exposed top surface 247 of the second portion 140 of the RDL trace 120.

Figure 6:
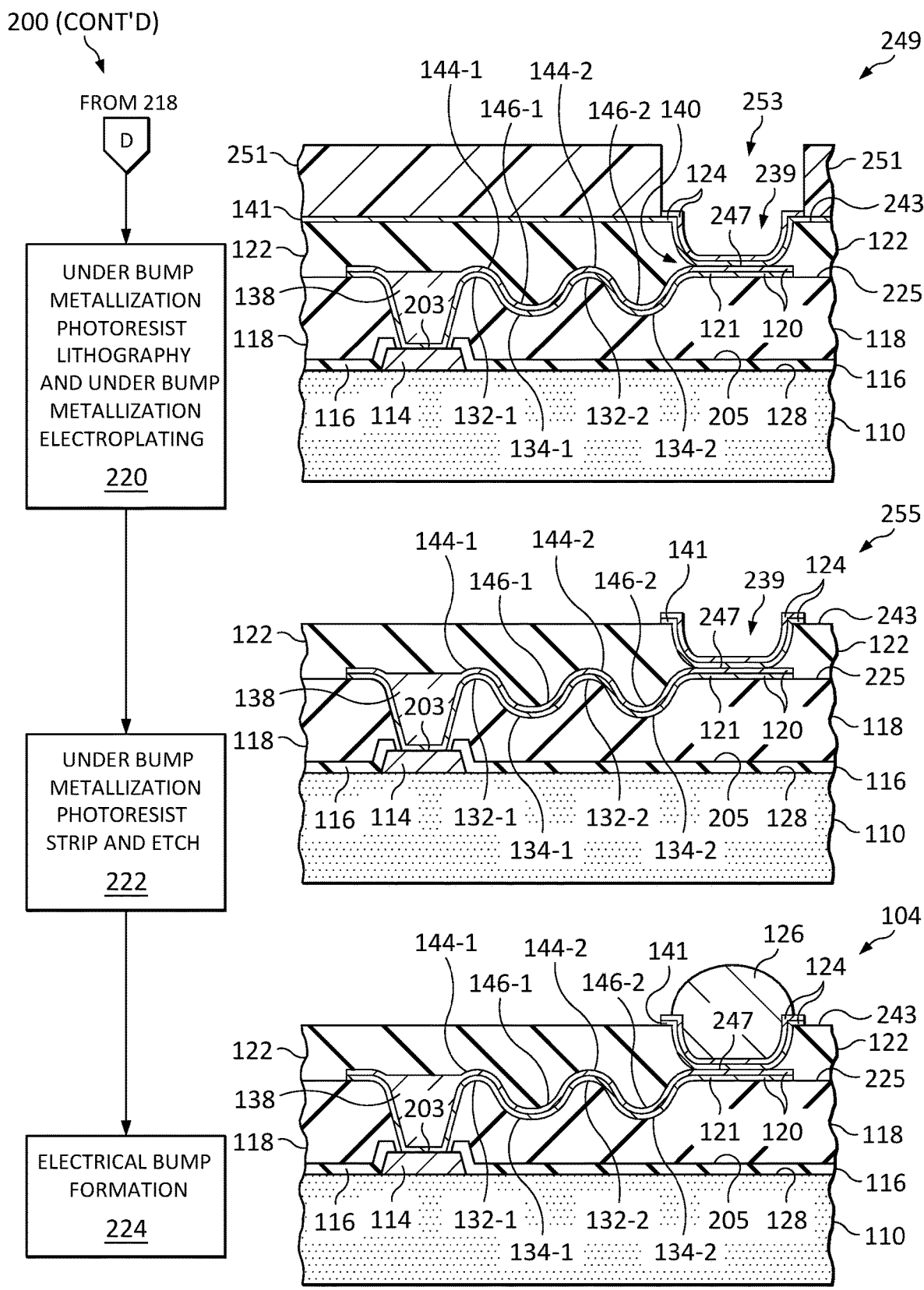
FIG. 6 illustrates a continuation of the method illustrated in FIG. 2 to FIG. 5 including processes for patterning the under bump metallization and forming an electrical bump in accordance with one or more embodiments.

Turning to FIG. 6, the method 200 continues at block 220 with the forming of the final UBM layer 124, resulting in modified workpiece 249. For example, a photoresist layer/mask 251, is formed and patterned on the UBM seed layer 241 in accordance with a desired redistribution pattern. Patterning is performed to form openings through the mask 253 to expose the UBM seed layer 241. An electrically conductive material is then formed in the openings of the mask 251 and on the exposed portions of the seed layer 241 to form the final UBM layer 124 in contact with a portion of the second re-passivation layer's layer top surface 143, sidewalls of the trench 239, and the exposed top surface 247 of the second portion 140 of the RDL trace 120. The UBM seed layer 241, in one or more embodiments, comprises both the seed layer 141 and the electrically conductive material deposited thereon.

At block 222, the mask 251 and portions of the UBM seed layer 241 on which the UBM material is not formed are removed, resulting in modified workpiece 255. The mask 251 is removed using an acceptable process, such as an ashing or stripping process. Once the mask 251 is removed, the exposed portions of the UBM seed layer 241 are removed using an acceptable process, such as an etching process include wet etching, dry etching, or the like. At block 224, a bumping process is performed to form the electrical bump(s) 126, resulting in the semiconductor device package 104 described above with respect to FIG. 1. For example, an electrical bump material is deposited over the second re-passivation layer 122 and the UBM layer 124. The electrical bump material comprises, for example, solder, copper, aluminum, gold, nickel, silver, palladium, tin, the like, or a combination thereof. The electrical bump material is reflowed into a spherical shape using a high-temperature reflow process to form the electrical bump. The electrical bump 126 is formed in electrical contact with the second portion 140 of the RDL trace 120 through the UBM layer 124 or, if the UBM layer 124 is not formed, the electrical bump 126 is formed in physical contact with the second portion 140 of the RDL trace 120. As such, the non-planar configuration 108 of the RDL trace 120 is disposed between the signal input (i.e., the electrically conductive pad 114 and via 138) and the signal output (e.g., electrical bump 126) of the semiconductor device package 104, which provides increased stress buffering and relaxation for the RDL electrical interconnections compared to a conventional planar (straight) RDL configuration.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A semiconductor device package comprising:
   a semiconductor chip;
   a first re-passivation layer disposed over a surface of the semiconductor device chip, wherein the first re-passivation layer includes an opening that exposes a top surface of an electrically conductive pad, and the first re-passivation layer further includes a non-planar portion relative to the surface of the semiconductor chip adjacent to the opening; and
   a redistribution layer (RDL) trace disposed in conformal contact with the first re-passivation layer, wherein the RDL trace comprises a non-planar configuration relative to the surface of the semiconductor chip adjacent to the opening, wherein the non-planar configuration comprises a first area of the RDL trace having a first height and a second area of the RDL trace having a second height different than the first height.

2. The semiconductor device package of claim 1, wherein the non-planar configuration comprises at least one peak and at least one valley in the RDL trace.

3. The semiconductor device package of claim 1, wherein the semiconductor device package further comprises:
the electrically conductive pad disposed below the first passivation layer and in contact with the semiconductor chip and the RDL trace;
a second re-passivation layer disposed above and in contact with the RDL trace; and
an electrical connector disposed above and electrically coupled to the RDL trace.

4. The semiconductor device package of claim 3, further comprising:
a metallization layer disposed between the RDL trace and the electrical connector, wherein a first surface of the metallization layer contacts the RDL trace, and a second surface of the metallization layer contacts the electrical connector.

5. The semiconductor device package of claim 3, further comprising:
a passivation layer in contact with the surface of the semiconductor device and a bottom surface of the first re-passivation layer, and further in contact with the electrically conductive pad.

6. The semiconductor device package of claim 3, wherein the RDL trace comprises a first portion in contact with the electrically conductive pad, a second portion in contact with the electrical connector, and a third portion comprising the non-planar configuration, wherein the third portion is disposed between the first portion and the second portion of the RDL trace.

7. The semiconductor device package of claim 6, wherein a first surface of the third portion of the RDL trace transitioning from the first area of the RDL trace having the first height to the second area of the RDL trace having the second height is sloped such that a first obtuse angle is formed between the first area and the second area, and wherein a second surface of the third portion of the RDL trace transitioning from the second area to a third area of the RDL trace having a third height is sloped such that a second obtuse angle is formed between the second area and third area.

8. The semiconductor device package of claim 1, wherein the non-planar portion of the first re-passivation layer includes at least one peak having a first height above a bottom surface of the first re-passivation layer and at least one valley having a second height above the bottom surface of the first re-passivation layer, wherein the first height is greater than the second height.

9. The semiconductor device package of claim 8, wherein a range of a height difference between the first height of the at least one peak and the second height of the at least one valley is at least 2 micrometers.

10. The semiconductor device package of claim 8, wherein a range of a height difference between the first height of the at least one peak and the second height of the at least one valley is at least 5 micrometers.

11. The semiconductor device package of claim 8, wherein a thickness of the first re-passivation layer at the at least one valley is at least 5 micrometers.

12. The semiconductor device package of claim 8, wherein the non-planar portion of the first re-passivation layer includes multiple peaks having the first height above the bottom surface of the first re-passivation layer and multiple valleys having the second height above the bottom surface of the first re-passivation layer.

13. The semiconductor device package of claim 8, wherein the non-planar configuration of the RDL trace has a pattern along a plane orthogonal to the surface of the semiconductor chip that is selected from a group consisting of a hilling topography, a zig-zag pattern, a folding pattern, an undulating pattern, and a quasi-sinusoidal pattern.

14. A semiconductor device package comprising:
a semiconductor chip;
an electrically conductive pad disposed in contact with the semiconductor chip;
a redistribution layer (RDL) formed over the electrically conductive pad; and
an electrical connector disposed over and electrically coupled to the RDL, wherein the RDL comprises:
a first re-passivation layer disposed over a surface of the semiconductor chip, wherein the first re-passivation layer includes an opening that exposes a top surface of the electrically conductive pad, and the first re-passivation layer further includes a non-planar portion relative to the surface of the semiconductor chip between the opening and the electrical connector; and
an RDL trace comprising a first portion in contact with the electrically conductive pad, a second portion in contact with one of the electrical connector or an underlying metallization layer in contact with the electrical connector, and a third portion in conformal contact with the first re-passivation layer so that the RDL trace has a non-planar configuration relative to the surface of the semiconductor chip between the opening and the electrical connector.

15. The semiconductor device package of claim 14, wherein the non-planar configuration comprises at least one peak and at least one valley in the RDL trace.

16. The semiconductor device package of claim 15, wherein the at least one peak is disposed in at least a first area of the third portion of the RDL trace having a first height and the at least one valley is disposed in at least a second area of the third portion of the RDL trace having a second height different than the first height, and wherein a surface of the RDL trace transitioning from the first area to the second area is sloped such that an obtuse angle is formed between the first area and the second area.

17. A method of fabricating a semiconductor device package, comprising:
forming a first re-passivation layer over a surface of an underlying semiconductor chip device;
patterning the first re-passivation layer, wherein the patterning forms an opening that exposes a top surface of an electrically conductive pad and a first non-planar and undulating configuration in a portion of the first re-passivation layer relative to the surface of the semiconductor chip adjacent to the opening; and
forming a redistribution layer (RDL) trace in contact with the patterned first re-passivation layer, wherein the RDL trace comprises a second non-planar and undulating configuration relative to the surface of the semiconductor chip adjacent to the opening and conforming to the first non-planar and undulating configuration.

18. The method of claim 17, wherein the first non-planar and undulating configuration and the second non-planar and undulating configuration each comprise at least one peak and at least one valley.

19. The method of claim 17, wherein the first re-passivation layer is patterned using at least one of a grayscale mask or a multi-exposure process.

20. The method of claim 17, wherein patterning the first re-passivation layer forms the opening in the first re-passivation layer that exposes the electrically conductive pad, and wherein the electrically conductive pad is in contact with the semiconductor chip.

\* \* \* \* \*